US009831181B1

(12) United States Patent
Edelstein et al.

(10) Patent No.: US 9,831,181 B1
(45) Date of Patent: Nov. 28, 2017

(54) SIMULTANEOUS FORMATION OF LINER AND METAL CONDUCTOR

(71) Applicant: International Business Machines Corporation, Armonk, NY (US)

(72) Inventors: Daniel C Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/437,730

(22) Filed: Feb. 21, 2017

Related U.S. Application Data

(62) Division of application No. 15/217,566, filed on Jul. 22, 2016, now Pat. No. 9,721,788.

(51) Int. Cl.
*H01L 23/532* (2006.01)
*H01L 21/768* (2006.01)
(Continued)

(52) U.S. Cl.
CPC .. *H01L 23/53223* (2013.01); *H01L 21/76816* (2013.01); *H01L 21/76846* (2013.01); *H01L 21/76882* (2013.01); *H01L 23/528* (2013.01); *H01L 23/5226* (2013.01); *H01L 23/5283* (2013.01); *H01L 23/532* (2013.01);
(Continued)

(58) Field of Classification Search
CPC ......... H01L 21/02225; H01L 21/02247; H01L 21/02255; H01L 21/02329; H01L 21/02332; H01L 21/02697; H01L 21/28; H01L 21/28079; H01L 23/48; H01L 23/481; H01L 23/482; H01L 23/50; H01L 23/52; H01L 23/522; H01L 23/5226; H01L 23/528; H01L 23/5283; H01L 23/532; H01L 23/53204; H01L 23/53209;
(Continued)

(56) References Cited

U.S. PATENT DOCUMENTS 6,197,683 B1 3/2001 Kang et al.
6,337,289 B1 1/2002 Narwanker et al.
(Continued)

OTHER PUBLICATIONS

List of IBM Patents or Patent Applications Treated as Related.
(Continued)

*Primary Examiner* — Eduardo A Rodela
(74) *Attorney, Agent, or Firm* — Jeffrey S LaBaw; Steven J Meyers

(57) ABSTRACT

An integrated circuit device having a substrate including a dielectric layer is patterned with a set of conductive line trenches. Each conductive line trench has parallel vertical sidewalls and a horizontal bottom. A first metal layer fills a first portion of the set of conductive line trenches. The first metal layer is created by an anneal and reflow process of a first metal. A liner which is an alloy of the first metal and a selected element is formed at interfaces of the metal layer and a surface of the dielectric. The liner is created simultaneously with the metal fill by the anneal and reflow process. A wetting layer is disposed on the first metal layer and fills a second portion of the set of conductive line trenches. A second metal layer is disposed on the wetting layer and fills a remainder portion of the set of conductive line trenches.

8 Claims, 13 Drawing Sheets

(51) Int. Cl.
*H01L 23/522* (2006.01)
*H01L 23/528* (2006.01)

(52) U.S. Cl.
CPC .. *H01L 23/53209* (2013.01); *H01L 23/53214* (2013.01); *H01L 23/53219* (2013.01); *H01L 23/53252* (2013.01); *H01L 23/53266* (2013.01)

(58) Field of Classification Search
CPC ......... H01L 23/53214; H01L 23/53219; H01L 23/53223
See application file for complete search history.

(56) References Cited

U.S. PATENT DOCUMENTS

| | | | |
|---|---|---|---|
| 6,383,943 B1 | 5/2002 | Chen et al. | |
| 6,844,258 B1 | 1/2005 | Fair et al. | |
| 7,535,066 B2 | 5/2009 | Rotondaro et al. | |
| 8,013,446 B2 | 9/2011 | Yang et al. | |
| 8,420,531 B2* | 4/2013 | Yang | H01L 21/3105 257/E21.584 |
| 8,530,320 B2 | 9/2013 | Yang et al. | |
| 8,673,779 B1* | 3/2014 | Yoon | H01L 21/76883 257/E21.575 |
| 2011/0057317 A1 | 3/2011 | Koike | |
| 2013/0214411 A1 | 8/2013 | Kim et al. | |
| 2013/0292806 A1* | 11/2013 | Ma | H01L 29/06 257/632 |
| 2015/0333012 A1* | 11/2015 | Chang | H01L 21/76816 257/751 |
| 2016/0276150 A1* | 9/2016 | Xue | H01L 21/02274 |

OTHER PUBLICATIONS

J. A. Wilks et al., "Nitridation of organo-silicate glass: A self-limiting process for PVD Ta 1+ x N/Ta barrier formation," Applied Surface Science, vol. 255, No. 23, 2009, pp. 9543-9547.

* cited by examiner

US 9,831,181 B1

SIMULTANEOUS FORMATION OF LINER AND METAL CONDUCTOR

BACKGROUND OF THE INVENTION

This disclosure relates to integrated circuit devices, and more specifically, to a method and structure to create advanced metal conductor structures in semiconductor devices.

As the dimensions of modern integrated circuitry in semiconductor chips continues to shrink, conventional lithography is increasingly challenged to make smaller and smaller structures. With the reduced size of the integrated circuit, packaging the chips more closely together becomes important as well. By placing chips closer to each other, the performance of the overall computer system is improved.

It is typical to deposit a liner material prior to the deposition of a metal for forming a conductive line layer in semiconductor devices. In some applications, the liner material prevents the metal from diffusing into an underlying dielectric. However, as the dimensions of the features continue to shrink, the liner material takes up an increasing amount of the cross-section allocated to the conductive line. As the liner material is not as conductive as the metal, and conductivity at small cross-section dimensions is challenging, it would be advantageous to develop new technologies that reduce the effect of the liner material on conductivity.

BRIEF SUMMARY

According to this disclosure, an advanced metal conductor structure is described. An integrated circuit device having a substrate including a dielectric layer is patterned with a set of conductive line trenches. Each conductive line trench has parallel vertical sidewalls and a horizontal bottom. A first metal layer fills a first portion of the set of conductive line trenches. The first metal layer is created by an anneal and reflow process of a first metal. A liner which is an alloy of the first metal and a selected element is formed at interfaces of the metal layer and a surface of the dielectric. The liner is created simultaneously with the metal fill by the anneal and reflow process. A wetting layer is disposed on the first metal layer and fills a second portion of the set of conductive line trenches. A second metal layer is disposed on the wetting layer and fills a remainder portion of the set of conductive line trenches.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
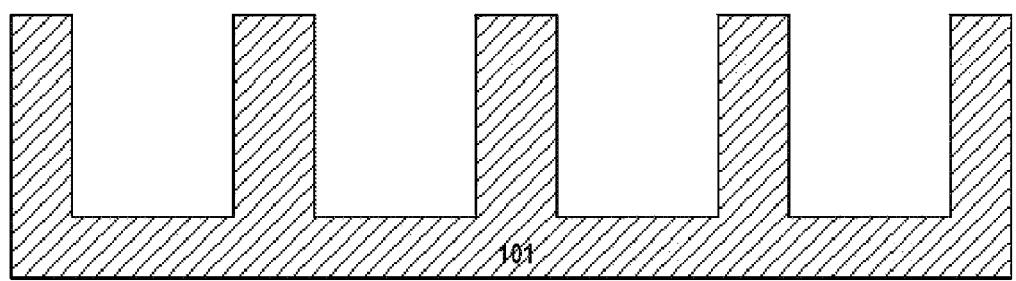
FIG. 1 is a cross-sectional diagram depicting the substrate structure after patterning and etching steps have been performed according to a first embodiment of the invention.

At a high level, the invention provides a method and resulting structure to form liner and conductor simultaneously in order to minimize the physical thickness of the liner, and thereby the liner cross-section portion of the total cross-section of the conductive line. In embodiments of the invention, this is achieved by performing a surface treatment of the patterned dielectric prior to metal deposition. In the conventional interconnect process, barrier liner(s) and conducting material are deposited separately. Also, physical thickness of the barrier liner(s) reduce(s) the volume fraction of the total conducting area, which becomes a critical issue as the feature dimensions gets smaller in the modern technology nodes.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram depicting the substrate structure after patterning and etching steps have been performed according to a first embodiment of the invention. As is known, a photoresist or sacrificial mandrel layer can be patterned over a dielectric layer. The subsequent etch will create the substrate structure depicted in FIG. 1. The dielectric layer 101 is silicon dioxide in preferred embodiments, however, other dielectric materials are used in other embodiments of the invention. Further, the dielectric layer 101 is preferably part of a multilayer structure comprising a plurality of materials. The conductive line pattern is a set of trenches formed in the dielectric 101 which have a set of vertical sidewalls and a set of horizontal bottoms. For ease in illustration, the trenches 102 which have been etched into the substrate are shown with a fairly low aspect ratio (H/D) of height (=H) to width (=D). In some embodiments of the invention the range of aspect ratios is 0.5 to 20 with aspect ratios of 1 to 10 being preferred. However, in the actual device, there may be high aspect ratios (Height/width) which are greater than 20:1. A typical range of heights of the dielectric conductive line pattern (or depths of the trenches) is from 100 nanometers to 2 micrometers and a typical range of width of an individual trench is 5 nanometers to 1 micrometers.

Figure 2:
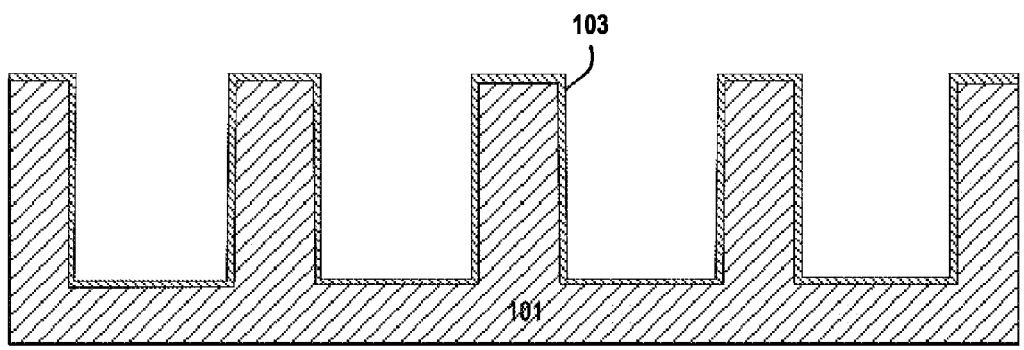
FIG. 2 is a cross-sectional diagram depicting the substrate structure after a surface treatment step has been performed according to a first embodiment of the invention.

FIG. 2 is a cross-sectional diagram depicting the structure after a surface treatment step has been performed according to a first embodiment of the invention. In the drawing, a surface treatment has been performed on the dielectric substrate resulting in an element enriched surface layer 103. The element enriched surface layer 103 is created on the sidewalls and bottom of the dielectric utilizing a plasma or thermal process which increases the concentration of a selected element in a surface portion of the dielectric. It is important to note that the treatment of the surface portion of the dielectric takes place in the dielectric layer itself and takes little, if any, additional cross-section. In one preferred embodiment, the surface treatment is a nitridation process and results in the formation of a nitrogen-enriched dielectric surface. The nitridation process is performed as a substitute to the deposition of a traditional liner material. Since the nitrogen-enriched dielectric surface takes little to no cross section from the trench cross-section and is instead formed from the dielectric material, a greater cross-section can be devoted to the metal of the conductive lines as compared to prior art methods of protecting the dielectric from the diffusion of the metal of the conductive lines.

The thermal nitridation process employed in embodiments of the present invention disclosure does not include an electrical bias higher than 200 W in a nitrogen-containing gas or gas mixture. The nitrogen-containing gases that can be employed in the present invention include, but are not limited to, N2, NH3, NH4, NO, and NHx wherein x is between 0 and 1 or mixtures thereof. In some embodiments, the nitrogen-containing gas is used neat, i.e., non-diluted. In other embodiments, the nitrogen-containing gas can be diluted with an inert gas such as, for example, He, Ne, Ar and mixtures thereof. In some embodiments, H2 can be used to dilute the nitrogen-containing gas. The nitrogen-containing gas employed in the present disclosure is typically from 10% to 100%, with a nitrogen content within the nitrogen-containing gas from 50% to 80% being more typical. In one embodiment, the thermal nitridation process employed in the present disclosure is performed at a temperature from 50° C. to 450° C. In another embodiment, the thermal nitridation process employed in the present disclosure is performed at a temperature from 100° C. to 300° C. for 30 minutes to 5 hours. In one set of embodiments, the resulting nitride enhanced layer is between 2 angstroms to 30 angstroms thick, but alternative embodiments can have thicknesses outside this range.

In some embodiments, a N2 plasma process is used to create the nitride layer which involves an electrical bias higher than 350 W. An N2 plasma can be controlled without damaging the dielectric with ion current density range: 50~2000 uA/cm2, and process temperature between 80 and 350 degrees C.

In other embodiments, other chemicals containing Si, C, and O or mixtures thereof can be used for the surface treatment. For example SiHx could be a source for Si, CHx could be a source for C, and O3 is a source for O. Both thermal and plasma techniques can be used for the treatment.

The thickness of the element enriched layer 103 can vary according to the type of metal layer being formed and the technique used in forming the same. Typically, the layer 103 has a thickness from 2 angstroms to 10 nm, with a thickness from 1 nm to 3 nm being more typical. The element enriched layer 103 prevents the diffusion of the subsequent metal layer into the dielectric.

Figure 3:
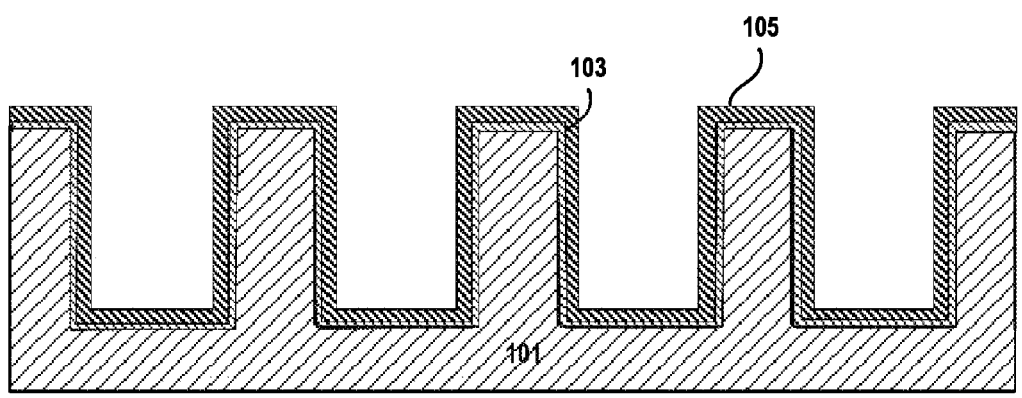
FIG. 3 is a cross-sectional diagram depicting the structure after a metal deposition step has been performed according to a first embodiment of the invention.

FIG. 3 is a cross-sectional diagram depicting the structure after a metal deposition step has been performed according to a first embodiment of the invention. Metals such as Al, Co, Ru, Ir, Rh, W or Ni can be deposited in this step. In one preferred embodiment, Al is used. The aluminum layer 105 (or alternative metal) can be formed by a conventional deposition process including, for example, chemical vapor deposition (CVD), plasma enhanced chemical vapor deposition (PECVD), atomic layer deposition (ALD), physical vapor deposition (PVD), sputtering, chemical solution deposition and plating. In preferred embodiments, the thickness of the Al layer 105 is at least sufficient to fill the trench area after a subsequent thermal anneal step reflows the Al layer. In preferred embodiments, the thickness of the Al layer will be in the range of 10 nm to 2000 nm, with a thickness from 30 nm to 800 nm being more typical. As illustrated, the metal deposition is substantially conformal over the element enriched layer 103, however, a conformal layer is not a requirement of the invention.

Figure 4:
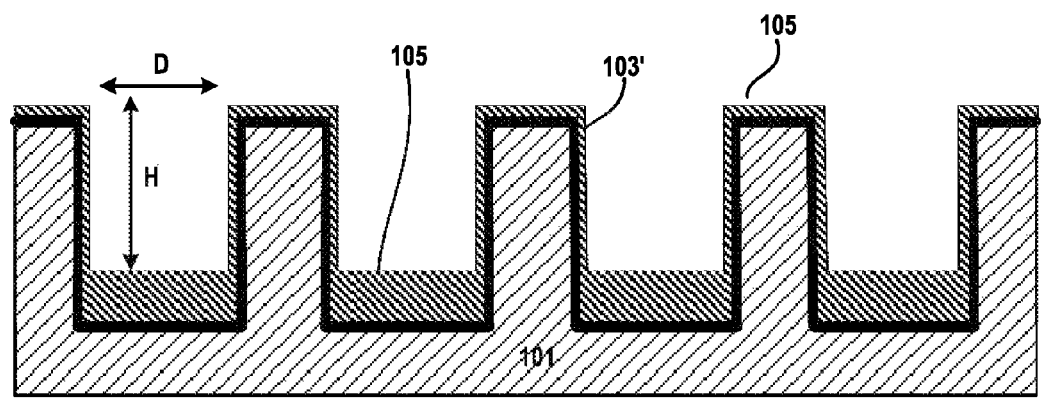
FIG. 4 is a cross-sectional diagram depicting the structure after a thermal anneal step has been performed according to a first embodiment of the invention.

FIG. 4 is a cross-sectional diagram depicting the structure after a thermal anneal step has been performed according to a first embodiment of the invention according to an embodiment of the invention. The surface treatment step described above forms the element enriched layer 103, wherein a selected element's concentration has been enhanced in the dielectric. The thermal anneal creates a chemical change at the interface between the Al layer 105 and the element enriched layer 103 creating an alloy liner 103' of Al and the selected element. In alternative embodiments, an alloy of the selected metal and the selected element is formed. For example, if a nitridation process was performed and the deposited metal is Al, an aluminum nitride layer 103' such as AlN is formed by the anneal. If the dielectric material 101 contains Si, a silicon containing aluminum nitride liner layer 103' such as Al(N, Si) is formed. Alternatively, if the dielectric material 101 does not contain Si, but the chemical used for the surface treatment contains both N and Si, an Al(N, Si) liner layer 103' is also formed. In the general case, if C is the selected element in the embodiment and M is the deposited metal, an MC liner layer 103' is formed.

In one preferred embodiment, the thermal anneal is carried out in a furnace between a temperature range between 100-500 degrees Centigrade in a neutral ambient, for example, in an N2, H2, He ambient or a mixture thereof. The thermal anneal is carried out for a period of 30 minutes to 5 hours in embodiments of the invention. In another embodiment, the thermal anneal is carried out through laser annealing. 20 nanoseconds to 5 minutes, 300-900 degrees Centigrade using a similar ambient.

The thermal anneal also reflows the aluminum (or other selected metal in other embodiments) from the field area into the patterned conductive line features due to capillary driving force. Thus, the thermal anneal step simultaneously forms both a new type of protective liner, for example Al(N, Si), and the conductor lines (by reflow). The reflow process not only forms an Al—N liner simultaneously, but has better feature fill quality than the normal deposition. The amount of metal deposited in the previous step is controlled so that only a portion of the trench is filled. In preferred embodiments of the invention, the aspect ratio (height/width=H/D) of the remaining portion of the trench at this point in the process will be greater than 2.5. Thus, the thermal anneal step simultaneously forms both a new type of protective liner, for example, Al(N,Si), and the conductor lines (by reflow). Because the liner is disposed in the cross section of the dielectric layer, there is a greater cross-section allocated to the conductive line. The deeper the conductive line feature, the more challenging it is for metal fill, i.e. manufacturability.

Although the embodiment described above has mostly been described in terms of a nitridation process to change the surface of the dielectric layer and aluminum as the metal fill material for the conductive lines, the reader should understand that any permutation of a surface treatment using N, Si, C, and O or mixtures thereof and of Al, Co, Ru, Ir, Rh, or Ni or mixtures thereof for the first fill metal is possible for embodiments of the invention depending on the conductive characteristics desired for the conductive line and the composition of the dielectric substrate. Some combinations of metal and selected element, in addition to Al(N, Si) and AN, which are desirable in different embodiments of the invention include Co (N, Si), Rh (N, Si), Ru (N, Si) and Ni (N, Si).

Figure 5:
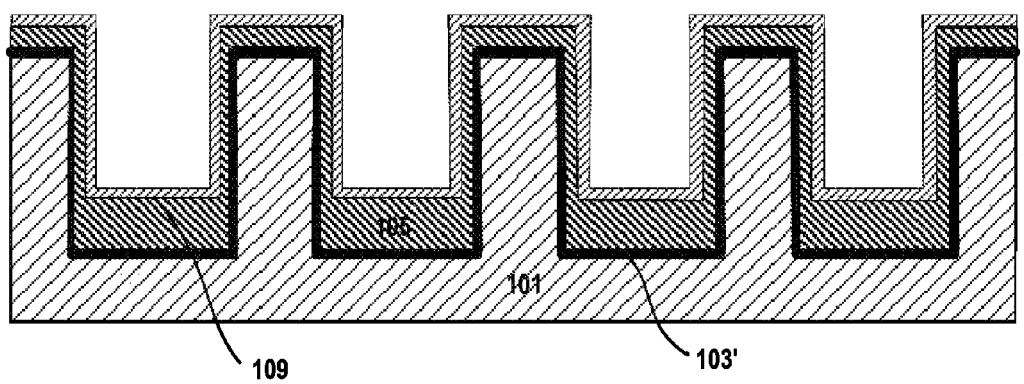
FIG. 5 is a cross-sectional diagram depicting the structure after a wetting layer deposition step has been performed according to a first embodiment of the invention.

FIG. 5 is a cross-sectional diagram depicting the structure after a wetting layer deposition step has been performed according to a first embodiment of the invention. The wetting layer 109 is selected from a group of materials including Co, Ru, Ir and Rh. The thickness of the wetting layer should be sufficient so that after the reflow step depicted in FIG. 6, the aspect ratio (Height/width=H/D) of the remaining portion of the trench at this point in the process should be less than 2.5 in preferred embodiments of the invention. In preferred embodiments of the invention, if the remaining A/R of the unfilled trench is still >2.5, the method repeats the steps depicted in FIGS. 5-6. After the anneal and reflow step, the wetting layer fills a second portion of the conductive line trench. In preferred embodiments of the invention, the aspect ratio of the first portion of the trench filled by the first metal is also less than 2.5. Empirical data indicates that keeping the aspect ratio of each metal fill layer less than 2.5 results in a better fill of the conductive line trench.

While the exact thickness of the wetting layer 109 will depend on the thickness of the metal layer 105 and the depth of the trenches, in preferred embodiments of the invention, the wetting layer will have a range of thickness from 2 nm to 2000 nm, with a thickness from 20 nm to 800 nm being more typical. The wetting layer 109 can be formed by a conventional deposition process including, for example, chemical vapor deposition (CVD), plasma enhanced chemical vapor deposition (PECVD), atomic layer deposition (ALD), physical vapor deposition (PVD), sputtering, chemical solution deposition and plating.

Figure 6:
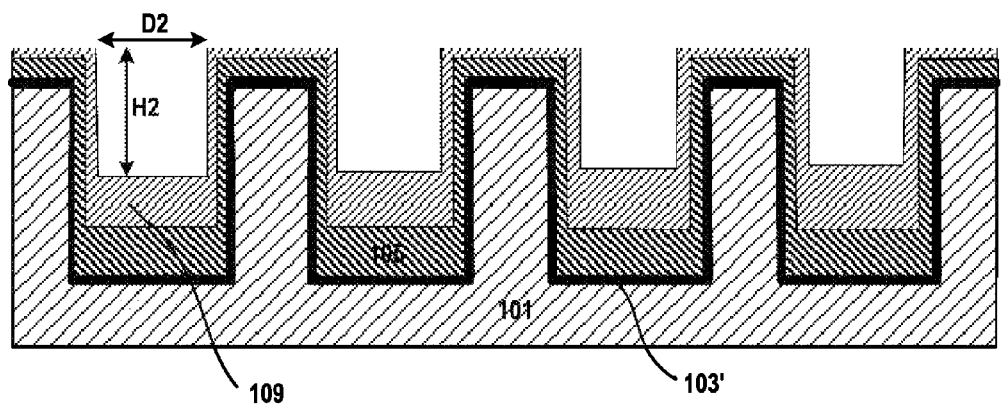
FIG. 6 is a cross-sectional diagram depicting the structure after a reflow step has been performed according to a first embodiment of the invention.

FIG. 6 is a cross-sectional diagram depicting the structure after a reflow step has been performed according to a first embodiment of the invention. The reflow step can be carried out under conditions similar to those described for the thermal anneal step described above. After the reflow step, in preferred embodiments of the invention, the aspect ratio (height/width=H/D) of the remaining portion of the trench will be less than 2.5. In preferred embodiments of the invention, if the A/R is still >2.5, the method repeats the steps depicted in FIGS. 5-6. In alternative embodiments of the invention, multiple layers of metal. The aspect ratio is controlled by a combination of original aspect ratio of the trench, the thickness of the metal layer 105 and the thickness of the wetting layer 109.

Figure 7:
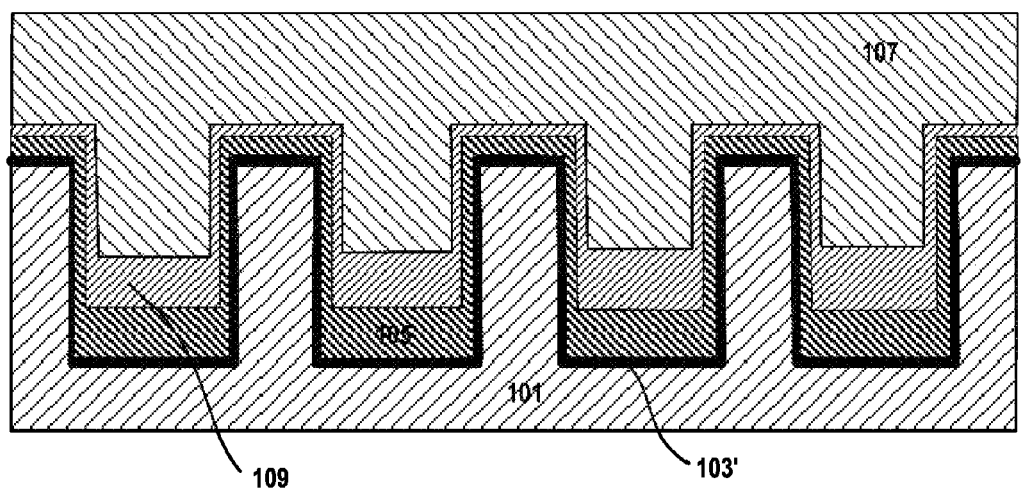
FIG. 7 is a cross-sectional diagram depicting the structure after a Cu deposition step has been performed according to a first embodiment of the invention.

FIG. 7 is a cross-sectional diagram depicting the structure after a Cu deposition step has been performed according to a first embodiment of the invention. The deposition of the copper layer 107 can be formed over the aluminum layer 105 utilizing any conventional deposition process including, for example, chemical vapor deposition (CVD), plasma enhanced chemical vapor deposition (PECVD), physical vapor deposition (PVD), sputtering, plating, chemical solution deposition, electroless plating, or combination of the same. The thickness of the copper layer can vary depending on the depth of the trench and the technique used in forming the copper layer. Typically, the copper layer 107 has an overburden thickness from 100 nm to 1000 nm, with a thickness from 300 nm to 800 nm being more typical. The overburden thickness (or area) is the Cu thickness above top of the patterned features. In alternative embodiments, a different second metal such as Co, W Ir, Rh, Ni or Ru can be used instead of the Cu layer 107. These metals can be deposited using the same types of deposition processes used for deposition of the copper.

Figure 8:
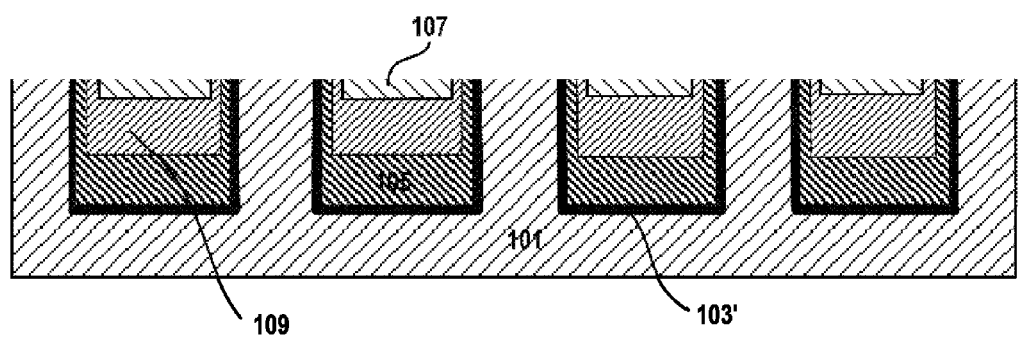
FIG. 8 is a cross-sectional diagram depicting the structure after a planarization step has been performed according to a first embodiment of the invention.

FIG. 8 is a cross-sectional diagram depicting the structure after a planarization step has been performed according to a first embodiment of the invention. The drawing depicts the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess portions of the Al layer 105 and Cu layer 107 in the field areas of the substrate outside the trenches of conductive line pattern in the dielectric 101. In preferred embodiments of the invention, the liner layer is also removed from the field areas of the dielectric where it is not needed. Other planarization processes are known to the art and are used in alternative embodiments of the invention.

Processing of additional layers of the integrated circuit device proceeds after the steps illustrated in the disclosure. For example, a second set of conductive lines could be created using an embodiment of the invention in subsequent steps if required for completion of the integrated circuit.

In preferred embodiments of the invention, the aspect ratio of the metal fill in the conductive trenches (including both the first, second (wetting layer) and third layers of metal) is greater than 5.0 (H/D<=5.0). In high aspect ratio trenches, multiple metal layers are usually required so that a good fill using multiple layers of metal is assured.

Figure 9:
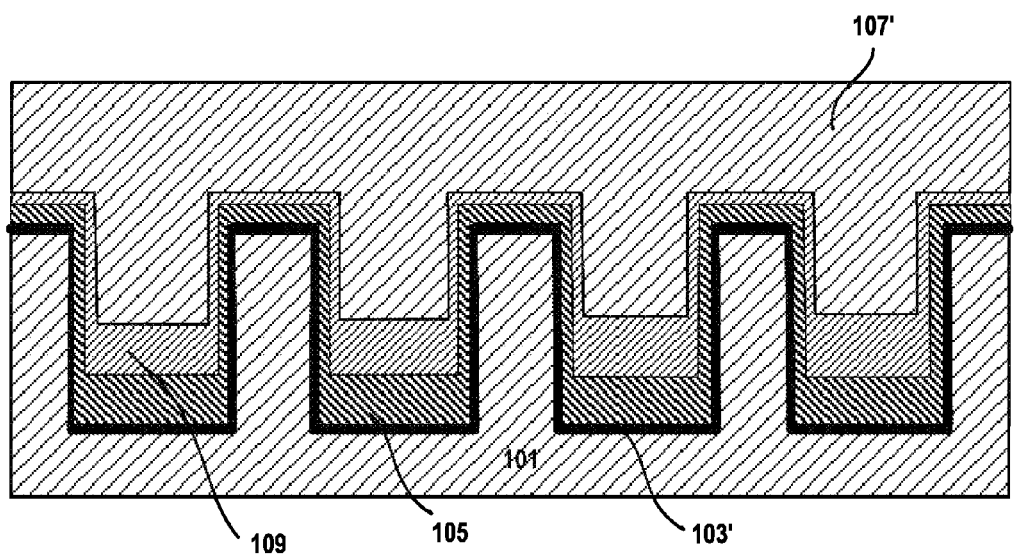
FIG. 9 is a cross-sectional diagram depicting the structure after a CuMn deposition step has been performed according to a second embodiment of the invention.

FIG. 9 is a cross-sectional diagram depicting the structure after a CuMn deposition step has been performed according to a second embodiment of the invention. The deposition of the copper manganese layer 107' (instead of the copper layer 107) can be formed over the wetting layer 109 utilizing any conventional deposition process including, for example, chemical vapor deposition (CVD), plasma enhanced chemical vapor deposition (PECVD), physical vapor deposition (PVD), sputtering, plating, chemical solution deposition, electroless plating, or combination of the same. The thickness of the copper layer can vary depending on the depth of the trench and the technique used in forming the copper layer. Typically, the copper manganese layer 107' has an overburden thickness from 100 nm to 1000 nm, with a thickness from 300 nm to 800 nm being more typical. The overburden thickness (or area) is the CuMn thickness above the top of the patterned features. In alternative embodiments, a different second manganese alloy such as CoMn, IrMn, RhMn, NiMn WMn or RuMn can be used instead of the CuMn layer 107'. These metals can be deposited using the same types of deposition processes used for deposition of the copper.

Figure 10:
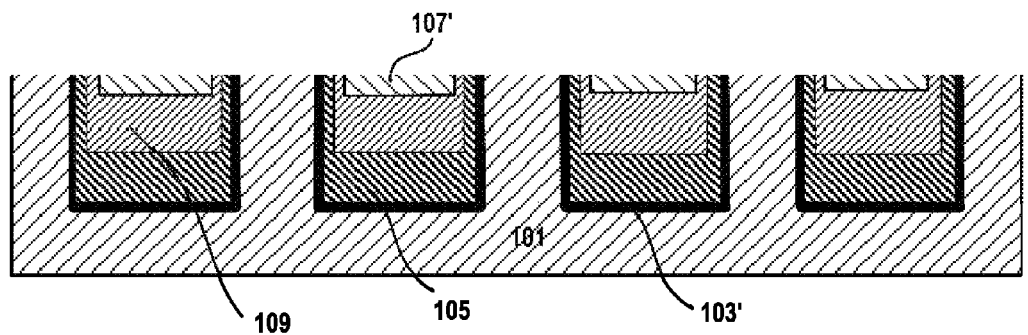
FIG. 10 is a cross-sectional diagram depicting the structure after an anneal step and a planarization step has been performed according to a second embodiment of the invention.

FIG. 10 is a cross-sectional diagram depicting the structure after an anneal step and a planarization step has been performed according to a second embodiment of the invention. The process conditions used in preferred embodiments of the invention are similar to those described above in connection with the first embodiment. As compared to the first embodiment depicted in FIG. 6, the Mn has been driven into the protective liner 103' so that an Al(N, Si, Mn) alloy is formed. There is an advantage to using an Mn alloy as the Mn, once incorporated into the liner by the anneal, further enhances the barrier property of the liner. Mn tends to react with oxygen (O) and/or nitrogen (N) in the dielectric to form a stable Mn(O, N). If the thermal annealing is long enough to reach a thermal equilibrium, all Mn will react with oxygen (O) and/or nitrogen (N) on the dielectric surface. In a practical case, there is a small amount of Mn left in the Cu after anneal.

Figure 11:
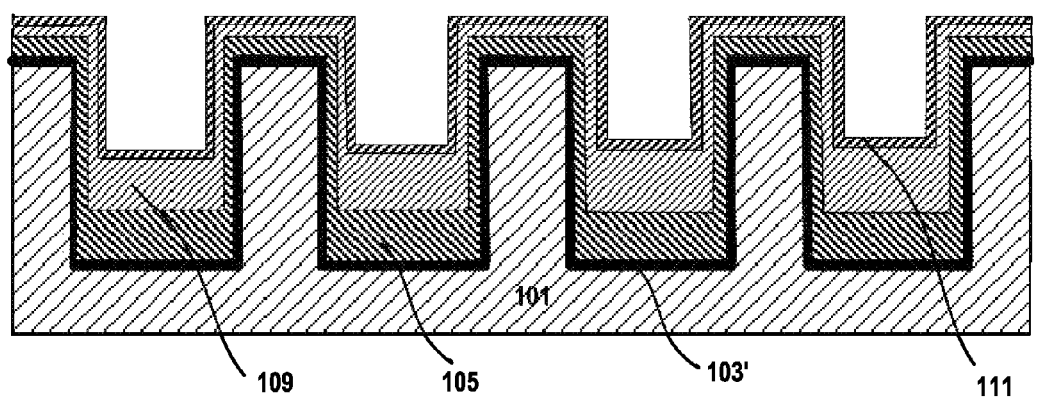
FIG. 11 is a cross-sectional diagram depicting the structure after a barrier layer deposition step has been performed according to a third embodiment of the invention.

FIG. 11 is a cross-sectional diagram depicting the structure after a liner deposition step has been performed according to a third embodiment of the invention. In this drawing, the steps of the first embodiment up to the thermal anneal are performed. Next, a liner material selected from the group of TaN, TiN, CoNi, RuN is deposited. The liner material is deposited as a barrier layer 111 over the reflowed wetting layer 109 utilizing any conventional deposition process including, for example, chemical vapor deposition (CVD), plasma enhanced chemical vapor deposition (PECVD), physical vapor deposition (PVD), sputtering, plating, chemical solution deposition and electroless plating. The thickness of the layer 109 can vary according to the type of layer being formed and the technique used in forming the same. Typically, the layer 109 has a thickness from 1 nm to 20 nm with a thickness from 2 nm to 10 nm being more typical. The liner material 109 prevents the diffusion of the subsequent metal layer into the dielectric 101, acting as an additional protective layer in addition to protective layer 103. In alternative embodiments of the invention, the order of the wetting layer 109 and the barrier layer 111 can be reversed so that the wetting layer is on top of the barrier layer.

Figure 12:
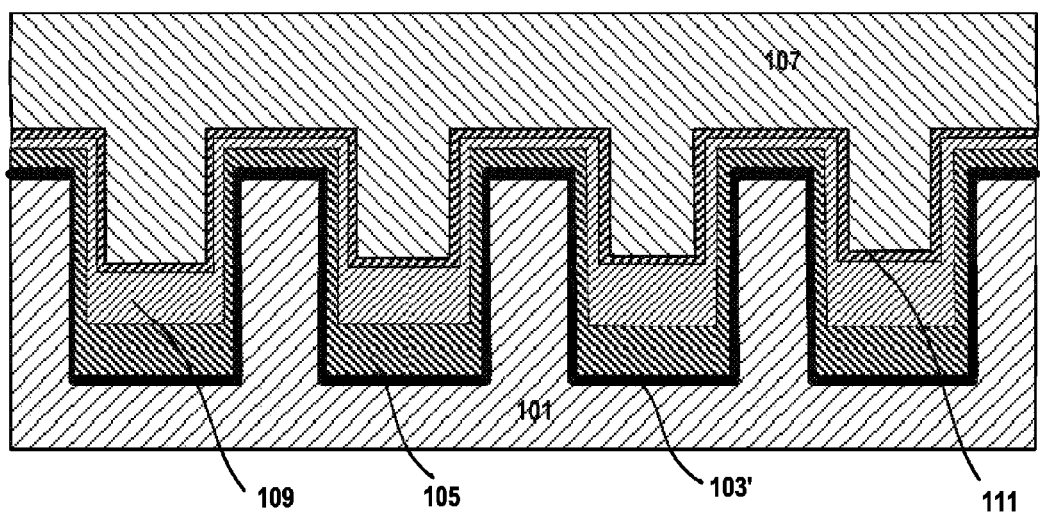
FIG. 12 is a cross-sectional diagram depicting the structure after a Cu deposition step has been performed according to a third embodiment of the invention.

FIG. 12 is a cross-sectional diagram depicting the structure after a Cu deposition step has been performed according to a third embodiment of the invention. This step is similar to the Cu deposition in the first embodiment described above. Also as described in the first embodiment, other metals such as Co, W Ir, Rh, Ni or Ru could be used as the second metal layer.

Figure 13:
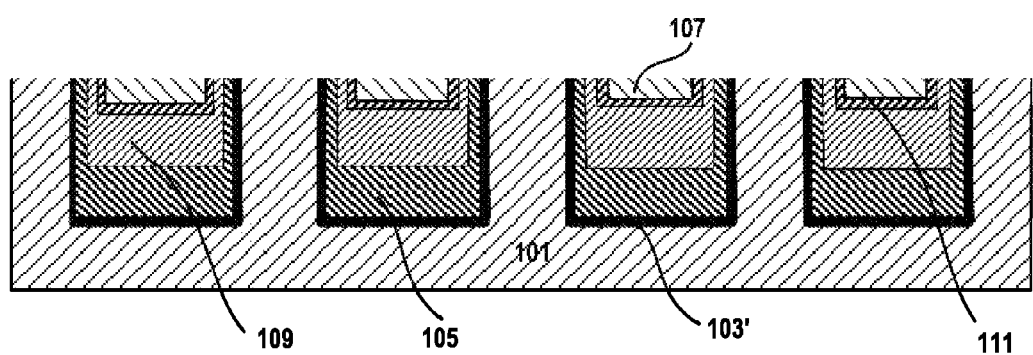
FIG. 13 is a cross-sectional diagram depicting the structure after a planarization step has been performed according to a third embodiment of the invention.

FIG. 13 is a cross-sectional diagram depicting the structure after a planarization step has been performed according to a third embodiment of the invention. The planarization process is similar to that described above in connection with the first and second embodiments. As compared to the first embodiment, the third embodiment offers greater protection against diffusion into the dielectric 101 from the second metal layer 107 as both the liner 109 and the protective layer 103 guard against diffusion of the second metal 107. Because of the protective layer 103, the liner 109 can be thinner than prior art processes. Also there is no liner layer 109 in the portion of the trench allocated to the first metal layer 105 so that portion of the trench is full of the metal.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. An integrated circuit device comprising:
    a substrate including a dielectric layer patterned with a set of conductive line trenches, each conductive line trench having parallel vertical sidewalls and a horizontal bottom;
    a first metal layer filling a first portion of the set of conductive line trenches, wherein the first metal layer is created by an anneal and reflow process of a first metal;
    a liner which is an alloy of the first metal and a selected element formed at interfaces of the first metal layer and a surface of the dielectric, the liner created simultaneously with the first metal layer by the anneal and reflow process;
    a wetting layer on the first metal layer filling a second portion of the set of conductive line trenches; and
    a second metal layer on the wetting layer filling a remainder portion of the set of conductive line trenches;
    wherein the first metal layer is comprised of aluminum and the selected element is nitrogen.

2. The device as recited in claim 1, wherein the liner is comprised of an alloy selected from the group consisting of AlN, Al(N, Si) and Al(N, Si, Mn).

3. The device as recited in claim 1, wherein the second metal layer is comprised of a metal selected from the group consisting of Cu, Co, Ru, Ir, W, Rh, and Ni.

4. The device as recited in claim 1, wherein the second metal layer in the set of conductive lines trenches is coplanar with a top surface of the dielectric in field areas of the dielectric layer.

5. The device as recited in claim 1 further comprised of a barrier layer disposed between the first and the second metal layers.

6. The device as recited in claim 1 wherein the liner is further comprised of a manganese alloy.

7. The device as recited in claim 1 wherein the aspect ratio of the total metal fill of the conductive lines is greater than 5.0.

8. The device as recited in claim 1, wherein the liner is formed in the element enriched surface layer of the dielectric layer.

* * * * *